United States Patent

[11] 3,593,412

[72] Inventor Robert S. Foote
Phoenix, Ariz.
[21] Appl. No. 843,717
[22] Filed July 22, 1969
[45] Patented July 20, 1971
[73] Assignee Motorola, Inc.
Franklin Park, Ill.

[54] BONDING SYSTEM FOR SEMICONDUCTOR DEVICE
6 Claims, 2 Drawing Figs.

[52] U.S. Cl. .......... 29/589, 317/234, 29/504
[51] Int. Cl. .......... B01j 17/00, H01l 7/02
[50] Field of Search .......... 29/589, 590, 504; 317/234

[56] References Cited
UNITED STATES PATENTS

| | | | |
|---|---|---|---|
| 3,025,439 | 3/1962 | Anderson .......... | 317/234 |
| 3,050,667 | 8/1962 | Emeis .......... | 317/24 |
| 3,298,093 | 1/1967 | Cohen .......... | 29/590 |
| 3,361,592 | 1/1968 | Quetsch et al. .......... | 260/78 |

*Primary Examiner*—John F. Campbell
*Assistant Examiner*—W. Tupman
*Attorney*—Mueller, Aichele & Rauner

ABSTRACT: A method of bonding a semiconductor device to a metal substrate involving depositing a gold solder preform onto the device and coating the metal substrate with a first layer of gold, a second layer of silver and a third layer of gold. The device is bonded to the metal substrate by heating the substrate to an elevated temperature and placing the gold preform on top of the third gold layer of the substrate.

PATENTED JUL 20 1971 3,593,412

INVENTOR.
Robert S. Foote

BY
Mueller, Aichele & Rauner
ATTY'S.

BONDING SYSTEM FOR SEMICONDUCTOR DEVICE

BACKGROUND

This invention relates to semiconductor device manufacture and more particularly to bonding a die on to a metal substrate.

The bonding of semiconductor die to metal headers or metal strips typically requires the use of gold. Since gold is expensive, efforts to reduce the amount of gold in a bonding system are conducted continuously. Silver is also used in bonding systems to prevent iron migration since it minimizes the porosity of the bond and prevents the iron in the metal substrate from migrating into the gold layer.

A widely used method in making contacts of the type previously referred to is to deposit a gold flash coating on the back side of the semiconductor wafer. This gold coating is very thin, that is, a few microns, so that it does not interfere with the scribe and break operation. The scribe and break operation involves scribing the front side of the semiconductor wafer with a grid of scribe marks and then inducing strains on the wafer thereby breaking the wafer along the scribe lines to form the individual die. In this method the gold flash plated surface of an individual semiconductor die is positioned on top of a heated gold plated header thereby bonding the die to the header. This method is relatively expensive since it requires a gold layer on the header which has a thickness of the order of 60 to 120 microinches.

SUMMARY OF THE INVENTION

It is an object of this invention to provide an improved method of attaching a die to a metal substrate. It is another object of this invention to reduce the amount of gold required for bonding a die to a header.

These and other objects are accomplished by a method in which a die having a gold solder preform thereon is bonded to a metal substrate having a first gold flash layer, a second layer of silver and a top layer of gold. The gold preform portion of the die is placed on top of the coated metal substrate which has been previously heated to a temperature exceeding 375° C., thereby bonding the die to the substrate.

Other objects and advantages of this invention will be apparent from the following detailed description, reference being made to the accompanying drawings wherein a preferred embodiment of this invention is shown.

DRAWINGS

DESCRIPTION OF THE ILLUSTRATIVE EMBODIMENT

Figure 1:
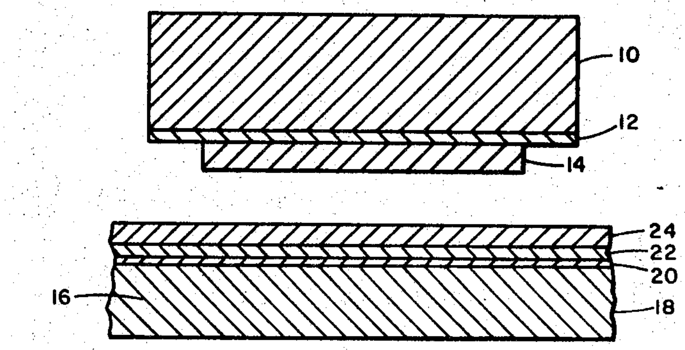
FIG. 1 is a cross-sectional view of the die and the plated metal substrate.

As shown in FIG. 1, the die 10 has a lower surface which is coated with a gold flash 12. The thickness of the gold flashing is about 1 to 3 microns. Bonded to the gold flash 12 is a layer of gold 14. This layer of gold 14 has a thickness of about 100 to 400 microinches (100 to $400\times10^{16}$ inches). The preferred thickness is about 200 to 250 microinches. Gold preform thicknesses above 400 microinches are more expensive and do not improve the quality of the bond. Preform thicknesses in the order of 100 to 150 microinches require extreme processing precautions to make a good bond.

The substrate 16 is any metal normally used in a "JEDEC" (Joint Electronic Design Engineering Council) approved header. An example is a header made of an iron-nickel-cobalt alloy which has thermal expansion characteristics similar to the glass used within the header. The substrate may be a strip of metal.

On top of the metal substrate 16 is a doped-gold layer 20 having a thickness of about 0.5 to 2 microinches. Layer 20 is doped with 1 percent nickel or less. Layer 20 is sometimes referred to as an "acid-plated gold layer" since it is plated in an acidic plating solution. On top of the doped gold layer 20 is a silver layer 22 which is about 8 to 10 microinches thick. This silver layer prevents iron migration from the metal substrate 18. This silver layer also imparts a minimum porosity to the bonding system. On top of the silver layer 22 is a gold layer 24 which is about 12 to 50 microinches thick. The preferred thickness is 12 to 14 microinches. The thickness of the gold layer 24 is greater than the thickness of the silver layer 22.

The total thickness of the three coatings is about 20 to 50 microinches, with the preferred thickness being about 22 microinches.

The amount of gold used on the die 10, that is, gold flash 12, and the gold preform layer 14 plus the gold used on the header or strip 16 in layers 20 and 24, is substantially less than the gold required to make a satisfactory bond in the prior art methods referred to above. The use of silver in conjunction with the gold layer 14 on the die and the top gold layer 24 on top of the header provides a system having good bonding properties and which costs substantially less than the prior art methods.

The header having the two gold layers and the silver layer is heated in an oven to a temperature in the range of 450° C. As the header comes out of the oven at a temperature of about 450° C., the die is positioned on top of the header so that the gold preform layer 14 comes in contact with the gold layer 24. A bond is formed between the gold layer 14 and the gold-silver layers 24 and 22.

Figure 2:
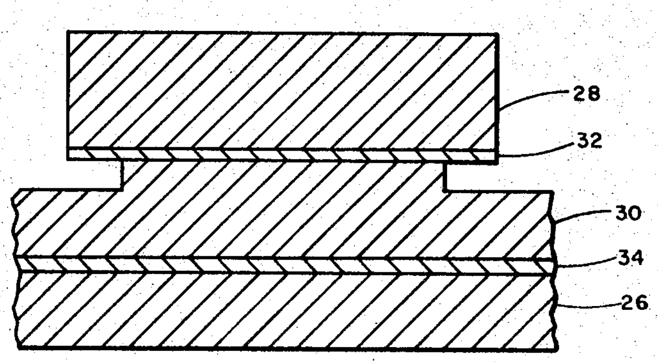
FIG. 2 is a side view of the die and the plated metal substrate after bonding.

As shown in FIG. 2, the resultant assembly in which the header 26 is bonded to die 28 by means of a gold-silver alloy 30, the gold-silver alloy forms a tight bond between the gold flash coating 32 attached to die 38 and to gold flash 34 attached to the header 26.

The resultant gold-silver alloy system shown in FIG. 2 forms a relatively inexpensive and more reliable bonding system than do prior art bonding systems utilizing substantially more gold.

EXAMPLE NO. 1

A silicon semiconductor was processed in the conventional manner to obtain a plurality of individual die thereon. The surface of the wafer on the opposite side of the wafer from the die had a thin gold flash layer applied thereto by conventional electroplating methods. The thickness of the gold flashing was about 2 to 3 microns. Gold preforms having a thickness of about 200 microinches were deposited on the wafer by electrodeposition, which is described in detail in my copending patent application Ser. No. 68174 which is incorporated herein by reference. The wafer was then broken up in the individual die separated.

The individual die, having a gold solder preform thereon, was then placed on top of a heated header, in accordance with this invention, as the header which was at a temperature of about 450° C. came out of the furnace. The header had a plurality of layers thereon including a gold flash layer about 2 to 3 microinches thick, a silver layer about 9 microinches thick, and a top gold layer of about 13 microinches thick. The die bonded tightly to the header.

While the invention has been described in terms of a preferred embodiment, the scope of the invention which I claim is defined in the following claims:

1. The method of bonding a semiconductor device onto a metal substrate comprising the steps of:

depositing a gold solder preform on said semiconductor device, coating a portion of said metal substrate with a first layer of gold, coating said first gold layer with a layer of silver about 8 to 10 microinches thick, coating said silver layer with a second layer of gold about 12 to 50 microinches thick, placing said semiconductor on said metal substrate whereby said gold preform is in contact with said second gold layer, and heating said substrate to a temperature sufficient to bond said device to said metal substrate.

2. The method as described in claim 1 wherein said gold solder preform has a thickness of about 100 to 400 mils.

3. The method as described in claim 1 wherein said first layer of gold has a thickness of about 0.5 to 3 microinches.

4. A method as described in claim 1 wherein said first and said second layer of gold and said layer of silver have a combined thickness of about 21 to 50 microinches.

5. A method as described in claim 1 wherein said heating step is between about 425° C. and 475° C.

6. The method of bonding a semiconductor device onto a header comprising the steps of:

coating a surface of said semiconductor device with a first layer of gold, depositing a gold solder preform on said first layer of gold, coating a portion of said header with a first layer of gold, coating said first gold layer with a layer of silver about 8 to10 microinches thick, coating said silver layer with a second layer of gold about 12 to 50 microinches thick, placing said semiconductor device on said header whereby said gold preform is in contact with said second gold layer, and heating said header to a temperature sufficient to bond said header to said device.